(12) United States Patent
Kawano

(10) Patent No.: US 6,597,902 B1
(45) Date of Patent: Jul. 22, 2003

(54) RADIO-FREQUENCY CIRCUIT MODULE

(75) Inventor: Hazime Kawano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 323 days.

(21) Appl. No.: 09/605,639

(22) Filed: Jun. 28, 2000

(30) Foreign Application Priority Data

Jun. 29, 1999 (JP) .............................. 11-183250
Mar. 15, 2000 (JP) ........................ 2000-072943

(51) Int. Cl.[7] ................................. H04B 1/08
(52) U.S. Cl. .................... 455/349; 455/347; 455/348
(58) Field of Search ................... 455/349, 348, 455/347; 333/246

(56) References Cited

U.S. PATENT DOCUMENTS 5,113,161 A      5/1992  Inami et al.
5,339,083 A  *  8/1994  Inami ........................ 342/157
5,471,181 A  *  11/1995 Park ........................... 333/246
5,796,315 A  *  8/1998  Gordon ....................... 333/24

FOREIGN PATENT DOCUMENTS

JP     3-129903    6/1991
JP     9-298409    11/1997

* cited by examiner

*Primary Examiner*—William Trost
*Assistant Examiner*—B Miller
(74) *Attorney, Agent, or Firm*—Burns, Doane, Swecker & Mathis, LLP

(57) ABSTRACT

In a radio-frequency circuit module, the surfaces for mounting the MIC, MMIC, or the like are separated into a plurality of planes and the separated planes are connected either by a coupling window or via a through hole. An RF connector for antenna connection is placed on a different surface as those of the other RF connectors. Alternatively, a radiator section of an antenna can be placed and formed on one plane of the radio-frequency circuit module. The mounting of the MIC, MMIC, or the like is realized by wire bonding or by bumps. The RF connectors are connected in a pseudo-coaxial line.

23 Claims, 15 Drawing Sheets

RADIO-FREQUENCY CIRCUIT MODULE

BACKGROUND OF THE INVENTION

1. Field of the Invention

The present invention relates to a radio-frequency circuit module such as a microwave circuit module, and particularly to assembling method and apparatus for a radio-frequency circuit module.

2. Description of the Related Art

Radio-frequency circuit modules are modules constructed by storing a plurality of radio-frequency circuit units, or one or more radio-frequency circuit units and a related circuit such as a control circuit, in a casing. Various types of radio-frequency circuit units are known including a microwave circuit unit used for a microwave band and a millimeterwave circuit unit used for a millimeterwave band. For example, as a microwave circuit unit, a monolithic microwave IC (MMIC) having a structure constructed by forming an active element such as a FET (field effect transistor) and with a passive element, such as a capacitor, on the surface or inside a semiconductor substrate, is known. As another microwave circuit unit, for example, a microwave IC (MIC) is known which has a structure constructed by mounting a discrete component such as a semiconductor element on a dielectric substrate on which a circuit element is formed. A microwave circuit, especially an MMIC or MIC, typically has a rectangular shape, similar to a circuit board on which the circuit is to be mounted and the package for storing the circuit board. The microwave circuit is also designed to have as low a height as possible. A radio-frequency circuit module having a microwave circuit stored as one of the radio-frequency circuits is called a microwave circuit module. The microwave circuit module can be realized by laminating a plurality of dielectric layers in a multi-layered structure.

2-1. Conventional Module

An example a conventional microwave circuit module having a multi-layered structure is shown in FIG. 17. The microwave circuit module having a cross section shown in the figure has a multi-layered structure constructed by laminating five dielectric layers 1 through 5. The multi-layered structure further includes conducting lines 6 through 10 respectively provided above each of the dielectric layers 1 through 5. The conducting lines 6 through 10 are not shown in the figure because they are thin layers compared to the dielectric layers 1 through 5. The conducting line 6, 8, and 10 provide signal transmission lines and the conducting lines 7 and 9 provide a ground potential. The circuit connection for maintaining the potentials of the conducting lines 7 and 9 and of a metal conductor layer 13 at a ground potential is not shown, but can be constructed by using a method and apparatus well known to those skilled in the art. The multi-layered structure is covered by a top lid 11 for protection at its upper end and the connecting section between the top lid 11 and the multi-layered structure is sealed by a sealing member 12. A metal conductor layer 13 is provided at the lower end of the multi-layered structure for providing a ground potential. A circuit to be stored in the microwave circuit module includes a microwave circuits, in the form of an MMIC, an MIC, etc., and a control circuit provided to control the microwave circuits in the form of an IC or the like. In the example shown in FIG. 17, a microwave circuit 14 for performing a predetermined process to a signal in a microwave band and a control circuit 15 for controlling the operation of the microwave circuit 14 are stored inside the multi-layered structure.

For the microwave circuit 14 and the control circuit 15 to be operated as intended, RF connectors for inputting a microwave signal to the microwave circuit 14 and for outputting a microwave signal from the microwave circuit 14 and control-signal pins for inputting a control signal to the control circuit 15 must be provided. In the microwave circuit module shown in FIG. 17, two RF connectors 16, and six control-signal pins 17 are provided at the lower end of the multi-layered structure, as shown in FIG. 18. The RF connectors 16 have a coaxial structure and their inner conductors 18 penetrate through the multi-layered structure to reach near the microwave circuit 14, as shown in a partially enlarged FIG. 19. The connection by a wire 16 between the inner conductor 18 and a conductor at a predetermined section of the microwave circuit 14 are formed by a method such as wire bonding or the like. An outer conductor of the RF connector 16 is connected to the metal conductor layer 13 and can be extended to the inside of the multi-layered structure if that is necessary. Dielectrics 20 are provided between the inner conductor 18 and members within the multi-layered structure, especially various conductors. Microwave signals supplied from an outside circuit are supplied to the microwave circuit 14 through one of the RF connectors 16. One or more processes such as amplification, modulation, phase-shift, or the like is applied to the signals by the microwave circuit 14 and the signals are output through the other RF connector 16 to an outside circuit.

The control-signal pins 17 are placed at a cut portion provided within the metal conductor layer 13 to secure a gap to prevent the control-signal pins 17 from short-circuiting with the metal conductor layer 13. One end of the group of control-signal pins 17 protrudes from the multi-layered structure at the bottom for connection to an outside circuit and the other end of the control-signal pins 17 is embedded within the multi-layered structure. A portion of the control-signal pins 17 embedded within the multi-layered structure is connected to the control circuit 15 through a wire 21. It is, for example, possible to provide a through hole 22 on each layer, penetrating through the dielectric layers 1 through 5, insert each of the control-signal pins 17 through the series of through holes 22 so that one end is above the dielectric layer 5, and connect the end above the dielectric layer 5 to the conductor on the control circuit 15 through the wire 21 using a method such as wire bonding etc. Alternatively, it is also possible to embed or fill another conductor within the through hole 22 instead of penetrating the multi-layered structure by the control-signal pins 17, and to use the conductor for connecting the control-signal pins 17 and the control circuit 15.

The connection between the control circuit 15 and the microwave circuit 14 is provided by a conductor within a through hole 23 and wires 24 through 26 connected by a method such as wire bonding or the like. Specifically, the conductor at a predetermined section of the control circuit 15 is connected to a predetermined section of the conducting line 10 through a wire 24 and the conductor at a predetermined section of the microwave circuit 14 is connected to a predetermined section of the conducting line 8 through wires 25 or 26. The conducting lines 10 and 8 are connected by a conductor embedded or filled in the through hole 23.

2-2. Problems to be Solved

In the structure described above, it is possible to provide a microwave signal from an outside circuit to a microwave circuit 14 through the RF connector 16 and to provide a microwave signal processed at the microwave circuit 14 to an outside circuit through the RF connector 16, provide a control signal from the control circuit 15 to the microwave circuit 14 through a conductor within the through hole 23 to control the operation of the microwave circuit 14, and to provide a signal from an outside circuit to the control circuit 15 through the control-signal pins 17 to control the operation of the control circuit 15. However, this structure presents a problem when reduction of the size of the apparatus and a further integration are desired.

First, because there is only one surface where the microwave circuit 14 can be mounted, when a plurality of microwave circuits 14 are stored in a microwave circuit module, the projection area of the microwave circuit module becomes large. Specifically, the multi-layered structure shown in FIG. 17 only has one surface on which a microwave circuit 14 can be mounted, that being the grounded plane which is the conducting line 7. When mounting a plurality of microwave circuits 14, the grounded plane that is the conductor film 7 and a signal transmission plane that is the conductor film 8 must be widened so that it is possible to mount the microwave circuits 14 and to provide a microstrip line and bonding pads for connecting the conductors on the microwave circuits. This inevitably results in the projection area of the microwave circuit module seen from above or below the multi-layered structure becoming large.

Second, because a plurality of RF connectors 16 are provided on the same plane, there is a problem that the inside structure and the relative placement of the microwave circuit module and the peripheral devices are restricted. For example, in a microwave circuit module configured by modularizing a circuit for processing a microwave signal distributed by a feeding circuit and supplying the signal to an element antenna, a minimum of two RF connectors, one for supplying the microwave signal distributed from the feeding circuit to the microwave circuit 14 and another for supplying a microwave signal processed at the microwave circuit to the element antenna, are required. According to the structure shown in FIGS. 17 through 19, these RF connectors are placed on the same plane. In order to restrict the total projection area of the microwave circuit module, the feeding circuit, and the element antenna under this connector placement and to increase the integrity at the same time, the microwave circuit module, the feeding circuit, and, the element antenna must be aligned and closely arranged in that order in the laminating direction, because the element antenna must be open to radiate the microwave signal. When these structures are aligned in that order, because the feeding circuit is present between the microwave circuit module and the element antenna, a hole must be provided in the feeding circuit in order to connect the RF connector of the microwave circuit module to that of the element antenna, or, alternatively, a circuit for relaying the microwave transmission must be provided between the microwave circuit module and the element antenna within the feeding circuit. Both of these methods severely limit the design of the feeding circuit pattern and the area the feeding circuit pattern can occupy.

SUMMARY OF THE INVENTION

One object of the present invention is to provide a radio-frequency circuit module in which the projection area can be easily reduced, and in which structural and alignment restriction problems are infrequent.

A radio-frequency circuit module according to a preferred embodiment of the present invention comprises a first and a second radio-frequency circuit unit, a casing, and an inter-unit signal transmission line. The first and second radio-frequency circuit units are units for processing a radio-frequency signal such as, for example, a microwave circuit unit such as an MMIC or an MIC. The casing stores the first and second radio-frequency circuit units and comprises, in its interior, a first and a second radio-frequency circuit unit storing spaces and a first and a second transmission line planes. The first and second radio-frequency circuit unit storing spaces respectively store the first and second radio-frequency circuit units and can be realized by providing a hole penetrating any one of the dielectric layers when the casing is realized by laminating dielectric layers. The first and second transmission line planes which are parallel to each other may be provided as surfaces of the dielectric layers when the casing is realized by laminating dielectric layers.

The inter-unit signal transmission line interconnecting the first and second radio-frequency circuit units is provided to transmit a radio-frequency signal from the first radio-frequency circuit unit to the second radio-frequency circuit unit. The inter-unit signal transmission line has at least three portions. The first portion is a portion along the first transmission line plane, extending from the first radio-frequency circuit unit storing space. The second portion is a portion along the second transmission line plane, extending from the second radio-frequency circuit unit storing space. The third portion is a portion for electrically connecting the first and second portions.

By providing the third portion in the inter-unit signal transmission line as described above, it becomes possible to set the first and second transmission line planes as mutually different planes, and therefore, it is possible to overlap the projection areas of the first and second radio-frequency circuit units with each other. Specifically, it is possible to form a first and second radio-frequency circuit unit storing spaces so that at least a part of the projection of the first radio-frequency circuit unit and a part of the projection of the second radio-frequency circuit in the projection direction perpendicular to the first and second transmission line planes overlap, by providing an inter-unit signal transmission line having the first through third portions. This can be used to realize a reduced-size radio-frequency circuit module, such as a microwave circuit module suitable for use in a phased array antenna.

The third portion of the inter-unit signal transmission line can be realized by, for example, a three-dimensional structure along the direction intersecting the first and second transmission line planes for interconnecting the first and the second portions. As a first example of the three-dimensional structure, there is a structure which uses a (slot-shaped) coupling window. In this example, an opening is provided on a grounded conductor film having a maintained predetermined potential and parallel to and put between the first and second transmission line planes. This opening, or coupling window, called a first coupling window hereinafter to avoid confusion with other coupling windows, provides the electromagnetic coupling between the first and second portions through a dielectric layer. When the casing is realized by laminating dielectric layers, dielectric layers for constructing the casing can be used for the electromagnetic coupling path. As a second example of the three-dimensional structure, a structure using a through hole can be used. In this example, a dielectric layer present between the first and second portions can be pierced through by a conductor provided to extend from the first portion to the second portion.

In order to connect the first and second radio-frequency circuit units to an outside device, RF connectors are provided on the outside surface of the casing and connector-unit signal transmission lines are provided inside the casing. For example, to input a radio-frequency signal such as a microwave signal to the first radio-frequency circuit unit, a first RF connector is provided on the outside surface of the casing and a first connector-unit signal transmission line for connecting the first radio-frequency circuit unit to the first RF connector is provided for transmission of a radio-frequency signal from the first RF connector to the first radio-frequency circuit unit. For outputting a radio-frequency signal such as a microwave signal from the second radio-frequency circuit unit, a second RF connector is provided on the outside surface of the casing and a second connector-unit signal transmission line for connecting the second radio-frequency circuit unit to the second RF connector is provided for transmission of a radio-frequency signal from the second radio-frequency circuit unit to the second RF connector.

In an aspect of the present invention wherein both the first and the second RF connectors are provided, these RF connectors can be placed on different planes among the planes constructing the outside surface of the casing. In other words, conventionally, the RF connector for input and the RF connector for output must be provided on the same side viewed from the radio-frequency circuit unit because there is only one radio-frequency circuit unit mounting plane, but according to one embodiment of the present invention, because two or more radio-frequency circuit unit storing spaces are provided on the mutually-different planes to store an input-side (first) and output-side (second) radio-frequency units, the first RF connector corresponding to the first radio-frequency circuit unit and the second RF connector corresponding to the second radio-frequency circuit unit can be provided on different sides. In this manner, the degree of freedom for placement and structures of the radio-frequency circuit module and its peripheral devices and for type of connection with the peripheral devices can be increased. This also leads to a size reduction. Moreover, the first and second connector-unit signal transmission line can also be constructed to include a coupling window ("second coupling window"), similar to the inter-unit transmission lines.

The first and second connector-unit signal transmission lines can be constructed as a coaxial line. Because the first and second connector-unit signal transmission lines are lines embedded within the casing to penetrate at least one layer of a plurality of dielectric layers when the casing is formed by laminating a plurality of dielectric layers, it is preferable that these are constructed as a pseudo-coaxial line using the dielectric layers as a dielectric layer and using through holes to embed the conductors. Namely, the pseudo-coaxial line includes, as conductors, an inner conductor penetrating the dielectric layers, and an outer conductor formed by a plurality of separate conductors in respective through holes provided with a predetermined distance from the inner conductor.

If a radio-frequency circuit module according to the present invention is to be built into a set with a radiator section, such as a phased array antenna, it is preferable to construct the radio-frequency circuit module according to the present invention as a module further including the radiator section. For example, a radiator section can be provided on the outside surface of the casing, and a unit-radiator transmission line for connecting the second radio-frequency circuit unit to the radiator section can be provided inside the casing. In this manner, the RF connectors for connecting the radio-frequency circuit module and the element antenna are no longer necessary, and it is possible to reduce the cost due to reduced number of components and to reduce the size, due to the absence of the constraints on the connector arrangement. It is preferable that the first RF connector and the radiator section be provided on different surfaces.

A plurality of radiator sections can be provided on a module. In such a case, a plurality of second radio-frequency circuit units and first radio-frequency circuit units can be provided corresponding to each of the radiator sections. When such a configuration is employed with a small number of the first RF connectors, a branching member for branching the radio-frequency signals input from the first RF connector may be provided in, for example, the first connector-unit signal transmission line, to supply the branched signal to each of the first radio-frequency circuit units. The branching member can be realized by, for example, interconnecting or cascading m distributors (m being a natural number greater than or equal to 2) each for distributing the input radio-frequency signal to n branches(n being a natural number greater than or equal to 2) so that the radio-frequency signal input from the first RF connector is supplied to each of the first radio-frequency circuit units. Each distributor can be realized by a planar circuit such as a branch-line type distributor or a Wilkinson distributor. By providing a branching member as described above, an increase in the number of the first RF connectors can be prevented. Moreover, the branching member can be realized by a planar circuit, which can be realized without increasing the size of the casing by suitable pattern designing the conducting lines within the casing.

A typical structure of a casing is constructed as follows. A plurality of dielectric layers are laminated with a plurality of conducting lines each provided on a surface of one of the laminated dielectric layers. The shape of these dielectric layers is set so that, after forming, the first and second radio-frequency circuit unit storing spaces can be laminated with each other. Some of the conducting lines provide the first and second transmission line planes. The third portion penetrates through at least one of the dielectric layers. It is also possible to store, inside the casing, a control circuit for controlling the first and second radio-frequency circuit units. The control circuit can be stored in, for example, a hole provided on a dielectric layer located at the end of the laminated dielectric layers. This hole can be covered by a separately prepared lid.

The first and second radio-frequency circuit units are fixed to the casing by, for example, bumps. By employing bumps, the units can be fixed to the casing and at the same time, electrical connection to a connecting target conductor present in the casing can be achieved. It is preferable to use coplanar lines as the connecting target conductor.

DESCRIPTION OF THE PREFERRED EMBODIMENTS

Figure 17:
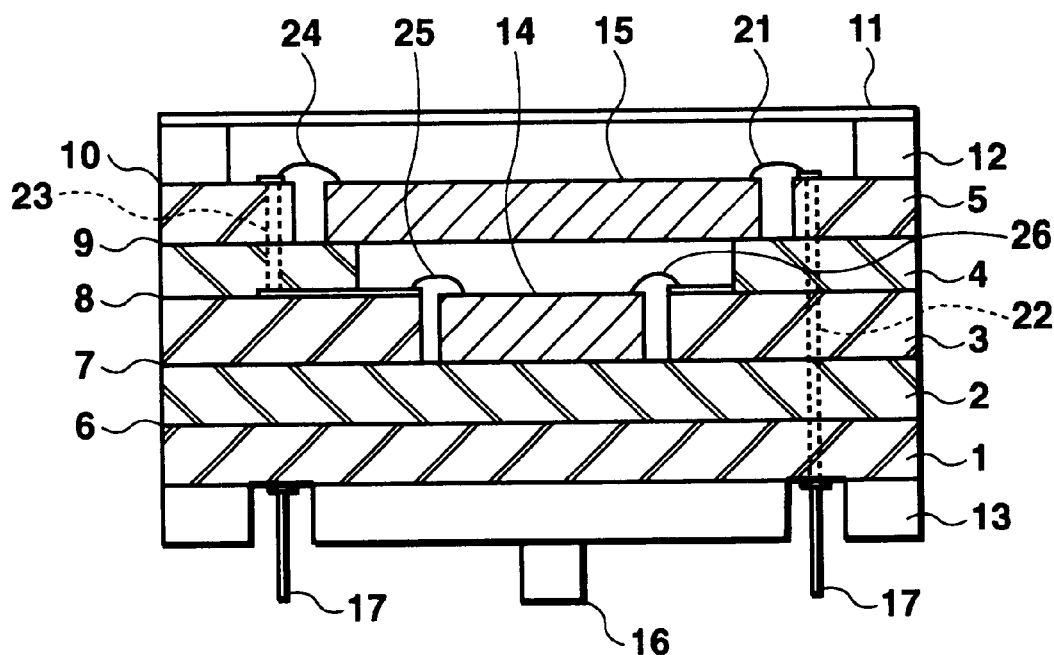
FIG. 17 is a I—I cross sectional view of a structure of a conventional microwave circuit module.
Figure 18:
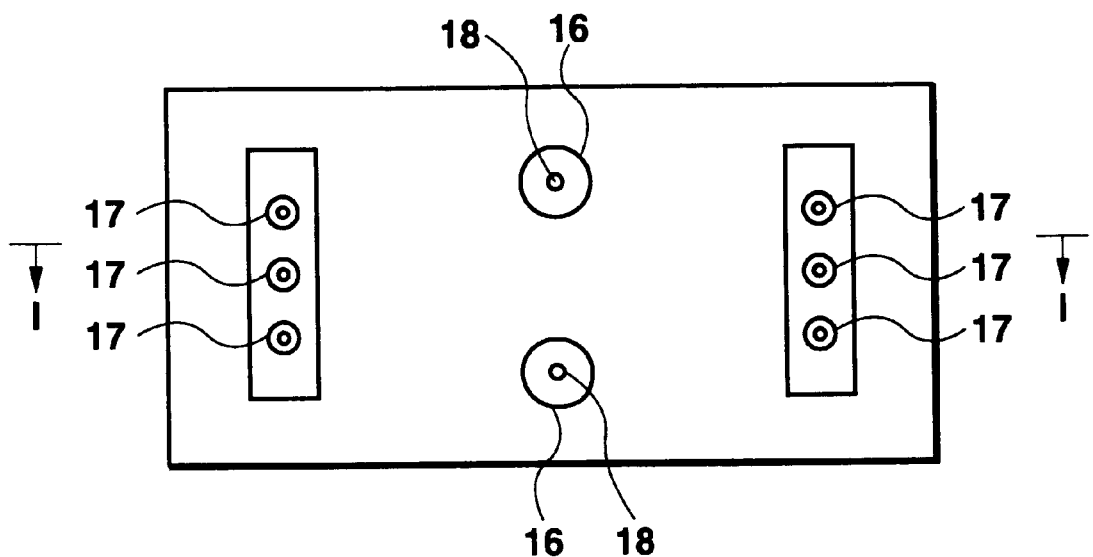
FIG. 18 is a planar view of the microwave circuit module shown in FIG. 17, seen from the lower side of the FIG. 1.
Figure 19:
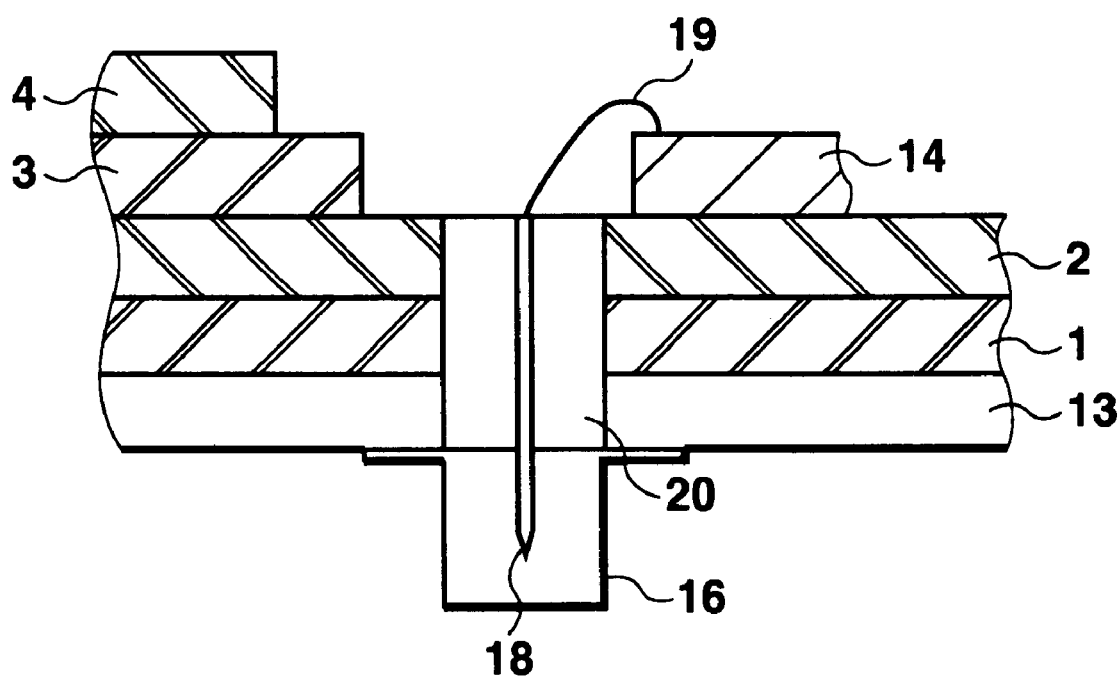
FIG. 19 is a partial cross sectional view showing the connecting portion between the RF connectors and the microwave circuit of the microwave circuit module shown in FIG. 17.

Preferred embodiments of the present invention are described hereinafter referring to the drawings. In the following description, structures similar or equivalent to those of the conventional structures shown in FIGS. 17 through 19 are referenced by the same reference numeral and the corresponding structures and will not be described again. Also, similar or equivalent structures among the embodiments are referred to by the same reference numeral and their description will not be repeated. In the following description, the present invention is, illustrated using application to a microwave circuit module as an example, but the present invention can also be applied to general modularized circuits which is in frequency bands other than the microwave band, such as millimeterwave band or the like. Also, although a module for an array antenna is used as an example of applying the present invention, the present invention is effective in applications other than the array antenna.

(a) First Embodiment

Figure 1:
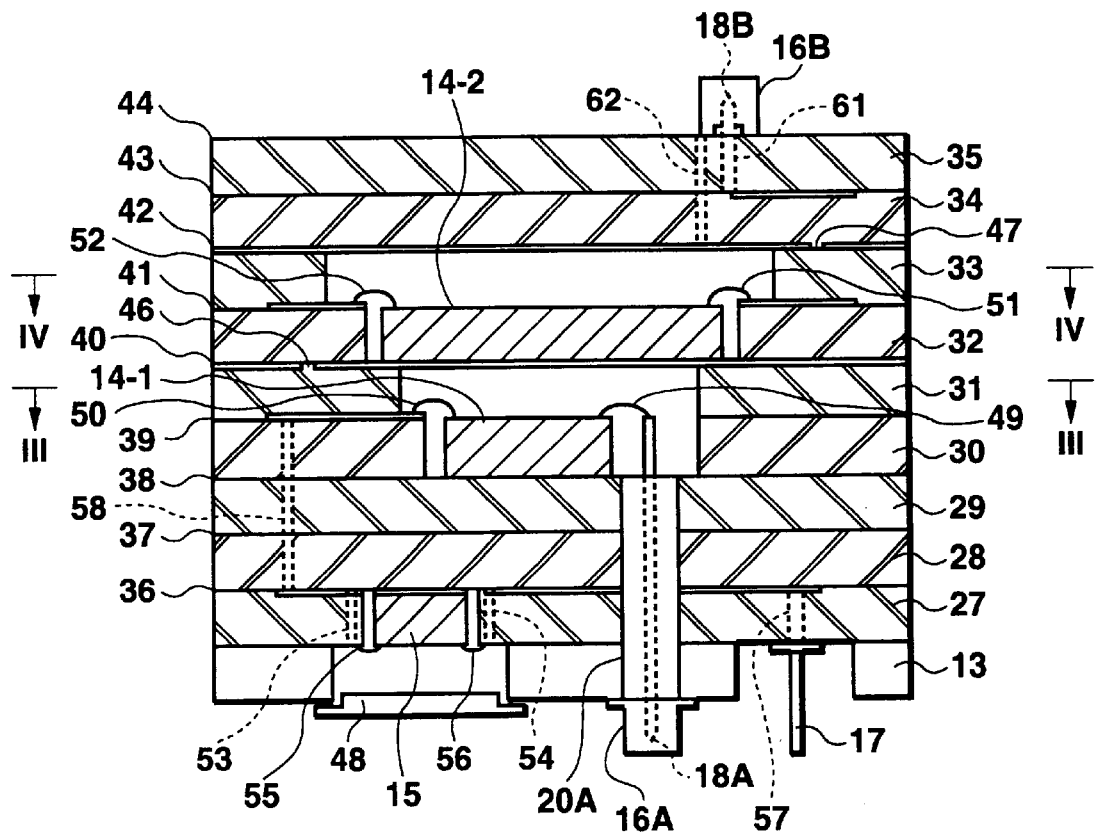
FIG. 1 is a II—II cross sectional diagram showing a structure of a microwave circuit module according to a first embodiment of the present invention.

FIG. 1 shows a structure of a microwave circuit module according to a first embodiment of the present invention. The microwave circuit module, a cross section of which is shown in FIG. 1, has a structure in which nine dielectric layers 27 through 35 are laminated, the nine dielectric layers having almost equal projection area. Inside the multi-layered structure of the dielectric layers 27 through 35, two microwave circuits 14-1 and 14-2 and a control circuit 15 are stored. That is, the multi-layered structure forms the framework for the microwave circuit module casing, with a metal conductor layer 13 provided below the multi-layered structure. Conducting lines 36 through 45 are portion-selectively arranged or formed on top of each of the dielectric layers 27 through 35 so that necessary shape patterns are provided.

Figure 3:
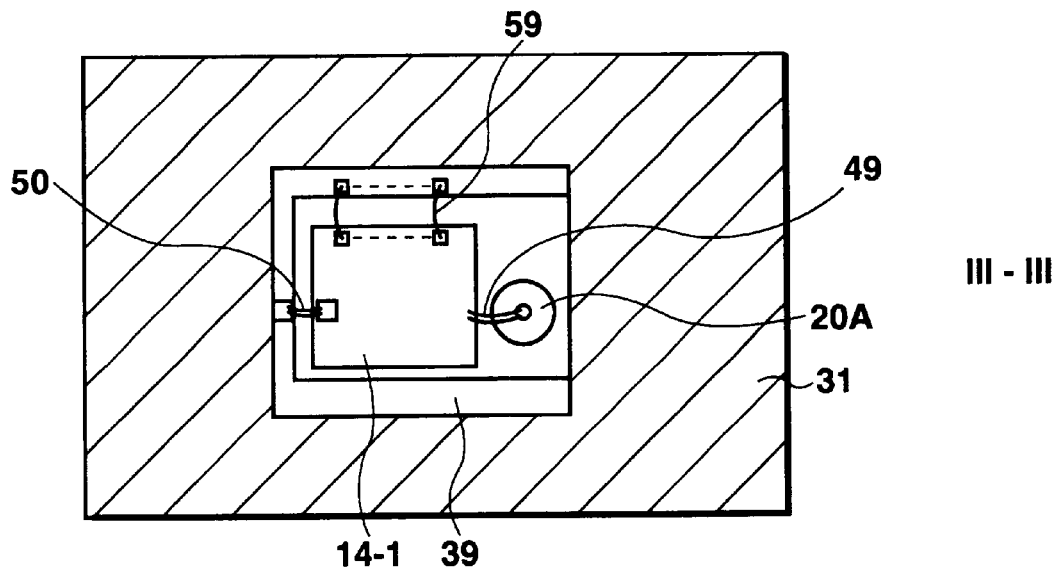
FIG. 3 is a III—III cross sectional diagram of the microwave circuit module shown in FIG. 1.
Figure 4:
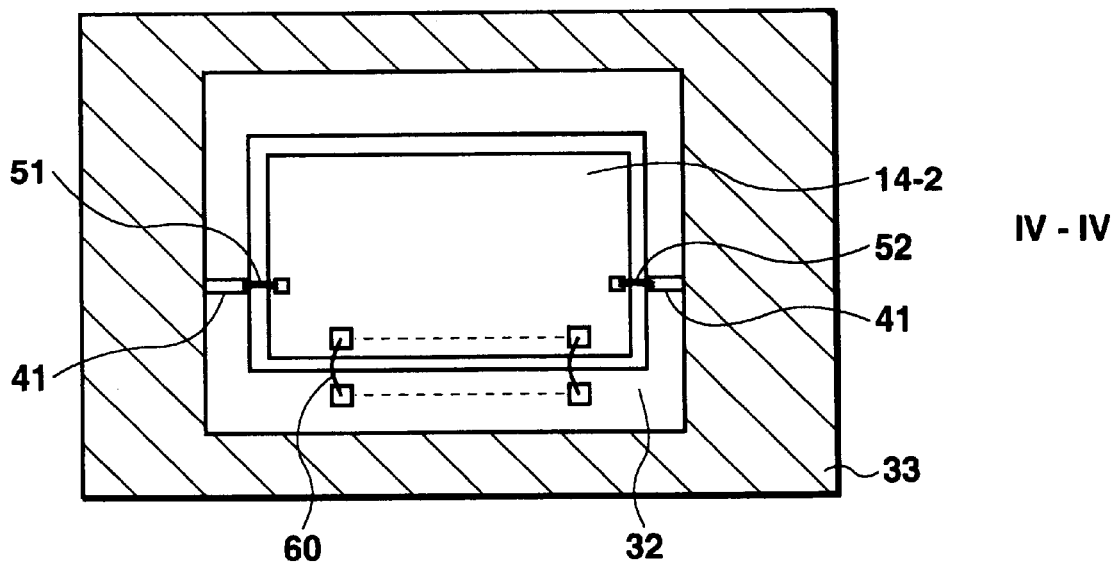
FIG. 4 is a IV—IV cross sectional diagram of the microwave circuit module shown in FIG. 1.

The microwave circuits 14-1 and 14-2 can be realized by an MMIC or an MIC which applies a predetermined process such as amplification, modulation, and phase-shift etc. to a microwave signal. In the illustrated example, these circuits have a thickness equal to or little less than that of the dielectric layers 30 and 32. A hole having an opening area larger than the projection areas of the microwave circuits 14-1 and 14-2 is provided in each of the dielectric layers 30 and 32 so that the microwave circuits can be stored. The cross section of these holes are shown in FIG. 1 and the opening planes of the holes are shown in FIGS. 3 and 4. The microwave circuits 14-1 and 14-2 are placed in these holes and fixed to the dielectric layers 29 and 31 located below the dielectric layers 30 and 32, or to the conducting lines 38 and 40 on top of the dielectric layers 29 and 31 by a method such as adhesion.

A hole having an opening area larger than the projection area of the microwave circuits 14-1 and 14-2 is provided on each of the dielectric layers 31 and 33 located above the dielectric layers 30 and 32 and on each of the conducting lines 39 and 41 below the dielectric layers 31 and 33 so that the microwave circuits 141 and 14-2 and peripheral devices do not conflict. The cross sections of these holes are shown in FIG. 1 and the opening planes of the holes are shown in FIGS. 3 and 4. In the first embodiment, because each of the microwave circuits and the surrounding conducting lines are connected by wire bonding, the holes on the dielectric layers 31 and 33 and on the conducting lines 39 and 41 have dimensions such that none of the microwave circuits or the bonding wire conflicts with the dielectric layers 31 and 33 and the conducting lines 39 and 41. The microwave circuits 14-1 and 14-2 are fixed to the dielectric layers 29 and 31 or the conducting lines 38 and 40 above the dielectric layers as part of the assembling sequence for laminating and fixing the dielectric layers 2 7 trough 35. The microwave circuits 14-1 and 14-2 are also connected to the conducing lines 39 and 41 and a conductor 18A through bonding wires 49 through 52, also as part of the assembling sequence.

The microwave circuit 14-2 and the dielectric layer 32 act as top lids for the microwave circuit 14-1 and the dielectric layers 34 and 35 act as top lids for the microwave circuit 14-2.

The control circuit 15 can be realized by an IC or the like for controlling the operation of the microwave circuits 14-1 and 14-2. The control circuit 15 has a thickness equal to or little less than that of the dielectric layer 27. A hole having a larger opening area than the projection area of the control circuit 15 is provided in the dielectric layer 28 for storing the control circuit 15. The control circuit 15 is placed inside this hole and is fixed to the dielectric layer 28 or to the conducting line 36 located below the dielectric layer 28 by a method such as adhesion.

Figure 2:
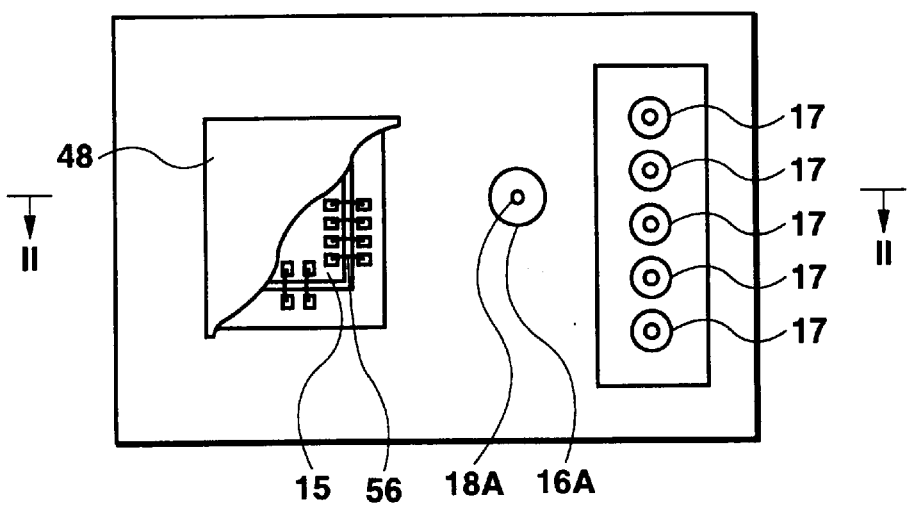
FIG. 2 is a plane view of the microwave circuit module shown in FIG. 1 seen from the lower side of FIG. 1.

A hole having a larger opening area than the projection area of the control circuit 15 is provided on the metal conductor layer 13 located below the dielectric layer 28 so that the metal conductor layer 13 does not conflict with the control circuit 15 and the peripheral members. The cross section of this hole is shown in FIG. 1 and a part of the opening plane of the hole is shown in FIG. 2. In the first embodiment, because bonding wires 55 and 56 are used in addition to through holes 53 and 54 as means for connecting the control circuit 15 and the conducting line 36, the hole on the metal conductor layer 13 has a dimension such that the control circuit 15 and bonding wires 55 and 56 do not conflict with the metal conductor layer 13 (refer to FIG. 2). The control circuit 15 is fixed to the dielectric layer 28 or to the conducting line 36 below the dielectric layer 28 and connected to the conductor 36 through conductors embedded or filled inside the through holes 53 and 54 and wires 55 and 56 in a part of the assembling sequence for laminating and fixing the dielectric layers 27 through 35.

Among the holes provided on the metal conductor layer 13, the hole directly below the control circuit 15 is closed by a cover 48 formed by a member such as a metal or the like. In FIG. 2, a portion of the cover 48 is omitted to show the control circuit 15 etc., but the cover 48 has a rectangular shape such that the cover 48 covers the entire hole.

Among the conducting lines 36 through 45, the conducting lines 37, 38, 40, 42, and 44 are formed and used as a grounded conductor, a microwave circuit mounting plane providing conductor, or a coupling window forming conductor, and the conducting lines 36, 39, 41, and 43 are formed and used as a signal transmission line providing conductor or a control circuit providing conductor. Because these films are much thinner than the dielectric layers 27 through 35, they are not shown in the figures except as required for description of the function or the structure.

The conducting lines 37, 38, 40, 42, and 44 have a projection area outline almost equal to, or slightly less than, those of the dielectric layers 27 through 35 and are maintained at a ground potential by a known structure (not shown) such as a through hole connection. Thus, the conducting lines 37, 38, 40, 42, and 44 provide grounded planes along with the metal conductor layer 13 which also has a ground potential. The conducting lines 38 and 40 provide planes for mounting microwave circuits 14-1 and 14-2, respectively.

A coupling window 46 and a coupling window 47 are respectively provided on the conducting lines 40 and 42. The coupling windows 46 and 47 are sections where no conductor is present and can be obtained by removing or selectively not forming a part of the conducting lines 40 and 42. As shown in the FIGS. 1 and 5, which respectively show a cross section and periphery, the portion of the conducting line 39 extending to near the coupling window 46 opposes a portion of the conducting line 41 extending to near the coupling window 46, with the coupling window 46 in between. These portions are coupled by a leaked electromagnetic wave or electromagnetic coupling through the coupling window 46. Similarly, a portion of the conducting line 41 extending to near the coupling window 47 opposes a portion of the conducting line 43 extending to near the coupling window 47 (refer to FIGS. 1 and 6) with the coupling window 47 in between, as shown in FIG. 1. These portions are coupled by leaked electromagnetic wave or electromagnetic coupling through the coupling window 47. The coupling windows 46 and 47 have a slot shape in the shown example, but can also be any other shape as long as the coupling is well formed.

The conducting lines 36, 39, 41, and 43 provide signal transmission lines for control signal and microwave signal transmission. The control-signal pin 17 which acts as the terminal for inputting the external signal is placed in a hole or a cut portion provided on the metal conductor layer 13, as shown in FIGS. 1 and 2, so that the metal conductor layer 13 and the control-signal pin 17 do not conflict. As shown in FIG. 1, one end of the control-signal pin 17 protrudes from the bottom side of the metal conductor layer 13, while the other end extends through a through hole 57 provided on the dielectric layer 27 to connect to the conducting line 36. It is also possible to connect the control-signal pin 17 and the conducting line 36 through a separate conductor embedded or filled in the through hole 57. The conducting line 36 has a pattern which extends from the through hole 57 forming section to the through hole 54 forming section near the control circuit 15 and is connected to the control circuit 15 through the through hole 54 and a wire 56. Thus, a signal supplied from an outside circuit through the control-signal pin 17 is input to the control circuit 15 through the conductor in the through hole 57, a portion of the conducting line 36, the conductor in the through hole 54, and the wire 56. The control circuit 15 generates control signal to be supplied to the microwave circuits 14-1 and 14-2 based on the input signal.

The control signal path from the control circuit 15 to the microwave circuit 14-1 includes a wire 55, a conductor in the through hole 53, a part of the conducting line 36, a conductor in the through hole 58, a part of the conducting line 39, and a wire 59. Specifically, as shown in FIG. 1, the control circuit 15 is connected to the conducting line 36 through the wire 55 and the conductor in the through hole 53. The conducting line 36 has a pattern extending to near the through hole 58 forming section. A plurality of through holes 58 provided in sequence and embedded or filled with a conductor penetrate through the dielectric layers 28 through 30 from the conducting line 36 to the conducting line 39. As shown in FIG. 3, the conducting line 39 has a pattern extending to pads generally provided in plurality near the microwave circuit 14-1. These pads are connected to a conductor on the microwave circuit 14-1 by a method such as wire bonding. Thus, the control signal generated at the control circuit 15 is supplied to the microwave circuit 14-1 through this path to control the operation of the microwave circuit 14-1. The control signal path from the control circuit 15 to the microwave circuit 14-2 can be realized by employing conducting lines, through holes, and bonding wires similar to the control signal path from the control circuit 15 to the microwave circuit 14-1. Therefore, this will not be further described, except for a section of the route, a wire 60, shown in FIG. 4.

The microwave circuit module according to the first embodiment of the present invention processes a microwave signal supplied from an outside circuit through the RF connector 16A, first by the microwave circuit 14-1 and then by the microwave circuit 14-2, and supplies the processed signal to an outside circuit through the RF connector 16B.

As shown in FIG. 1, the RF connector 16A placed on the surface of the metal conductor layer 13 has a coaxial structure including an inner conductor 18A, a dielectric 20A, and an outer conductor. The outer conductor is connected to the metal conductor layer 13 and preferably extends into the multi-layered structure through the dielectric layers 27 through 29 with the inner conductor 18A and the dielectric 20A. One end of the inner conductor 18A extends to the bottom of the layout shown in FIG. 1 so that it can connect to an outside circuit. The other end of the inner conductor 18A extends to near the microwave circuit 14-1. As shown in FIG. 3, the inner conductor 18A is connected to a conductor for inputting microwave signal on the microwave circuit 14-1 by the wire 49 at the end near the microwave circuit 14-1. Thus, the microwave signal supplied from an outside circuit through the RF connector 16A is supplied to the microwave circuit 14-1 through the above-referenced coaxial structure and the wire 49.

Figure 5:
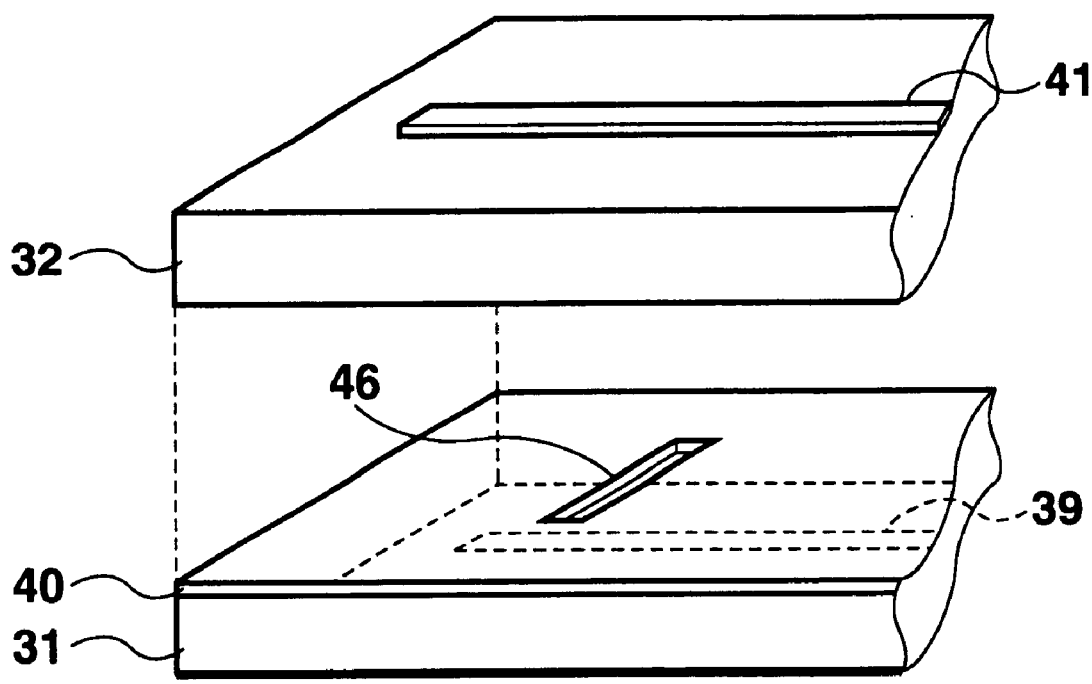
FIG. 5 is a partially disassembled perspective view showing a portion of the microwave circuit module shown in FIG. 1, especially the placement of a coupling window for coupling microwave circuit units.

The conductor for outputting the microwave signal from the microwave circuit 14-1 is connected to the conducting line 39 through the wire 50, as shown in FIG. 3. As shown in FIG. 1, the conducting line 39 has a pattern extending from the connecting section with the wire 50 to near the coupling window 46. As shown in FIG. 5, a portion of the pattern of the conducting line 41 is formed near the coupling window 46 to oppose the conducting line 39 with the coupling window 46 in between. The size, shape, and position of the coupling window 46 are designed so that the microwave signal processed by the microwave circuit 14-1 and transferred on the conducting line 39 will leak towards the conducting line 41 through the coupling window 46 in a form of an electromagnetic wave to reach the conducting line 41. In other words, the size, shape, and position of the coupling window 46 are designed so that the coupling window 46 can function as a type of local radiator element. For this design, it is preferable that the coupling coefficient between the conducting lines 39 and 41 through the coupling window 46 be sufficiently taken into consideration.

As shown in FIG. 1, the conducting line 41 has a pattern extending from near the coupling window 46 to near the microwave circuit 14-2. As shown in FIG. 4, the conducting line 41 is connected to a conductor for inputting the microwave signal on the microwave circuit 14-2 by the wire 52 near the microwave circuit 14-2. Thus, the microwave signal processed by the microwave circuit 14-1 is supplied to the microwave circuit 14-2 through the wire 50, the conducting line 39, the coupling window 46, the conducting line 41, and the wire 52.

Figure 6:
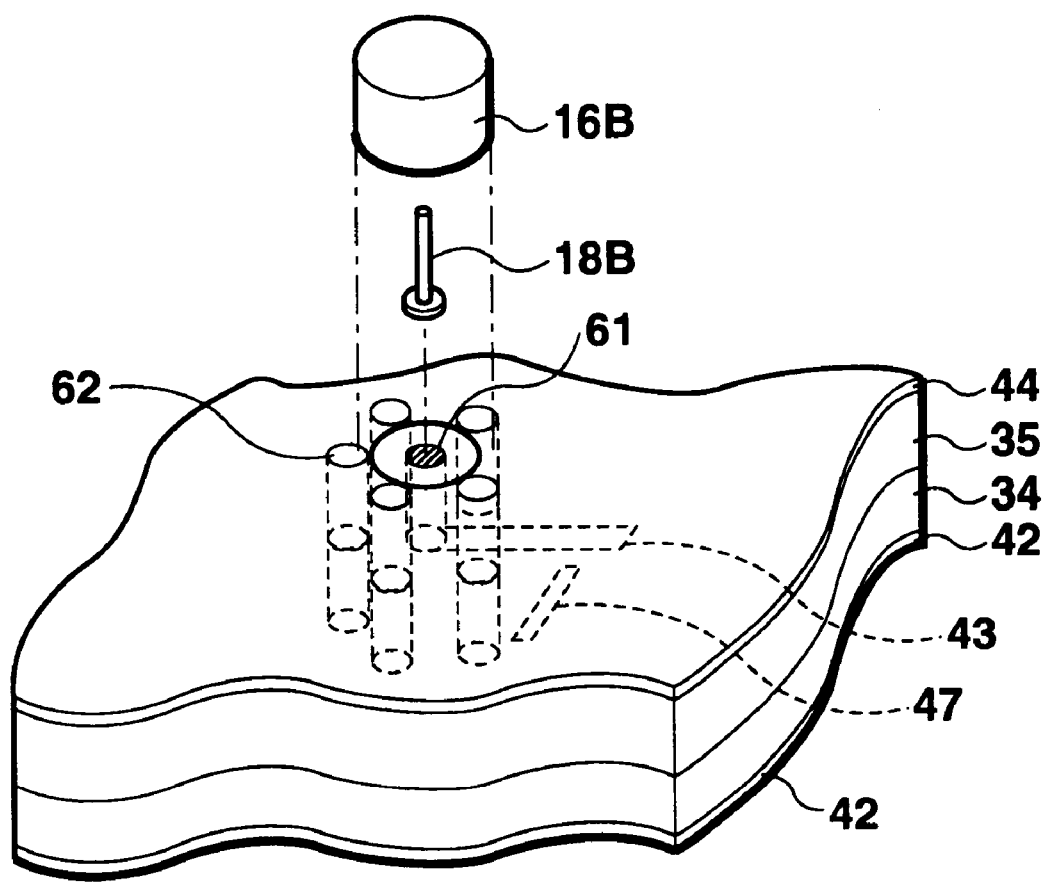
FIG. 6 is a partially disassembled perspective view showing a portion of the microwave circuit module shown in FIG. 1, especially the structure around the RF connector provided on the upper side of FIG. 1.

The conductor on the microwave circuit 14-2 for outputting the microwave signal is connected to the conducting line 41 though a wire 51, as shown in FIG. 4. As shown in FIG. 1, the conducting line 41 has a pattern extending from the connection section by the wire 51 to near the coupling window 47. As shown in FIG. 6, a portion of the pattern of the conducting line 43 is formed near the coupling window 47 to oppose the conducting line 41 with the coupling window 47 in between. The size, shape, and position of the coupling window 47 are designed so that the microwave signal processed by the microwave circuit 14-2 and transferred on the conducting line 41 can leak through the coupling window 47 towards the conducting line 43 in a form of an electromagnetic wave to reach the conducting line 43. In other words, the size, shape, and position of the coupling window 47 are designed so that the coupling window 47 functions as a type of local radiator element. For this design, it is preferable to sufficiently take into consideration the coupling coefficient between the conducting lines 41 and 43 through the coupling window 47.

As shown in FIGS. 1 and 6, the conducting line 43 has a pattern extending from near the coupling window 47 to near the through hole 61 of the dielectric layer 35. An inner conductor 18B is embedded or another conductor electrically connected to the inner conductor 18B is embedded or filled in the through hole 61. One end of the inner conductor 18B extends to above the dielectric layer 35 so that it can be used as an inner conductor of the RF connector 16B. The outer conductor of the RF connector 16B is connected to a grounded conducting line 44. Thus, the microwave signal processed at the microwave circuit 14-2 appears in the RF connector 16B through the wire 51, the conducting line 41, the coupling window 47, the conducting line 43, and the conductor in the through hole 61.

As shown in FIG. 6, a sequence of through holes 62 are formed around the through hole 61 penetrating through the dielectric layer 35, to penetrate through the dielectric layers 34 and 35. In the through hole 61, a conductor is embedded or filled for connecting to the conducting line 42 which provides the ground potential. By setting a constant distance of each of the through holes 62 with respect to the through hole 61 according to the required characteristic impedance, and by securing as great a number of through holes 62 as possible, a pseudo-coaxial structure is formed where the conductor in the through hole 61 functions as an inner conductor, the conductors in the through holes 62 an outer conductor, and the dielectric layer 35 a dielectric. In other words, the characteristics of the transmission line from the conducting line 43 to the RF connector 16B can be configured to be predetermined characteristics or a characteristic similar to the predetermined characteristics. To avoid a conflict between the through holes 62 and the conductor layer 43, the placement of the through holes 62 preferably has a horseshoe or arc shape.

As described, in the embodiment, by providing the coupling window 46 on the conducting line 40 as means for coupling the conducting lines 39 and 41, the mounting planes of the microwave circuits 14-1 and 14-2 can be configured to be separate surfaces. Because the grounded conducting line 40 and a hole on the dielectric layer 31 are present between the microwave circuits 14-1 and 14-2, coupling between the microwave circuits 14-1 and 14-2 in the vertical direction of the FIG. 1 is not generated. Therefore, the microwave circuits 14-1 and 14-2 can be placed so that portions of the projections of the microwave circuits 14-1 and 14-2, seen from the upper side of the FIG. 1, at least partially overlap. By employing this basic structure, the projection area of whole the microwave circuit module may be made less than the sum of the projection areas of the microwave circuits 14-1 and 14-2. In other words, according to the first embodiment of the present invention, by introducing the coupling window 46, an increase in the number of the mounting planes of the microwave circuits and a decrease in the projection area of the microwave circuit module may be simultaneously achieved. Moreover, the coupling window 46 can be realized by a simple step of either removing or not forming a part of the conductor on the conducting line 40 which acts as a grounded conducting line. The coupling window 46 also has a high reliability.

Figure 7:
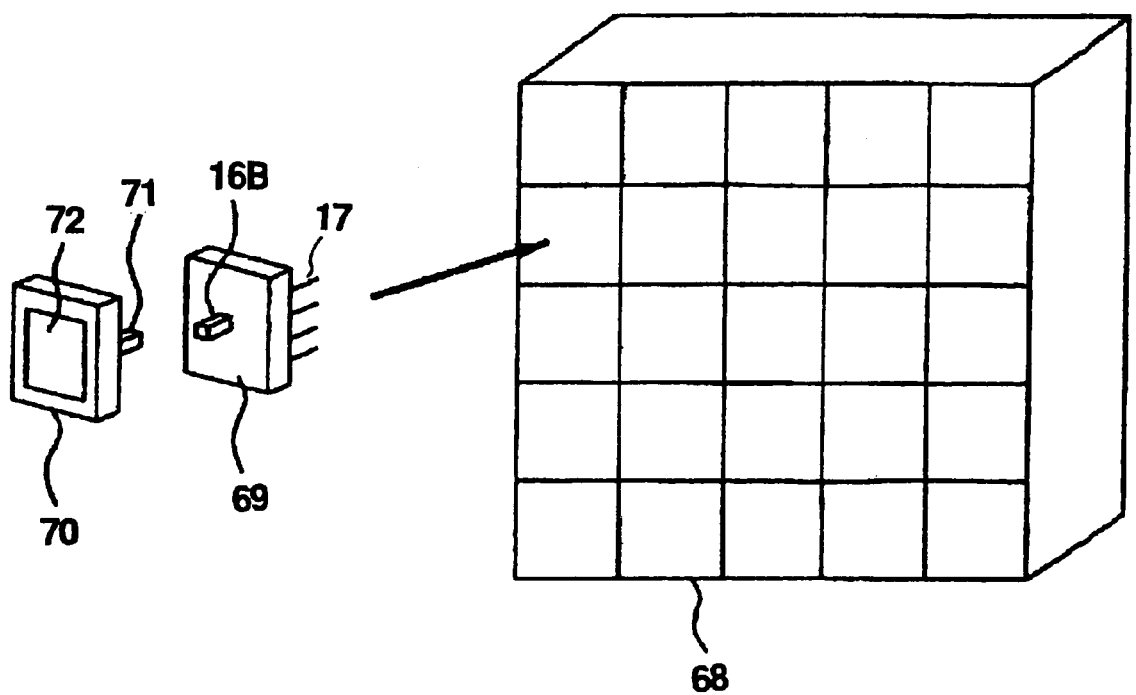
FIG. 7 is a partially disassembled perspective view showing one usage example of the microwave circuit module shown in FIG. 1.

In the first embodiment, because the conducting lines 41 and 43 are connected by providing the coupling window 47 on the conducting line 42, it is possible to provide the RF connector 16B on a side different from that where the RF connector 16A is provided. Because the degree of freedom is increased with respect to the RF connector position compared to the conventional structure, the restriction on the alignment of the circuits and devices to be placed around the microwave circuit module is reduced and the size of the entire structure including the peripheral circuits and devices can be reduced. For example, as shown in FIG. 7, when a portion of the circuits for a phased array antenna 68 is structured as a microwave circuit module 69 according to the embodiment and built into an array antenna 68 with a corresponding element antenna 70, because the control-signal pin 17 and the RF connector 16A of the microwave circuit module 69 are placed on a plane opposite from that where the RF connector 16B are placed, there is no need to provide the feeding circuit on the side of the RF connector 16B, seen from the microwave circuit module 69. The feeding circuit, although not shown, can be placed on the side of the control-signal pin 17 and the RF connector 16A, seen from the microwave circuit module 69. Moreover, because a method of directly connecting an RF connector 71 of the element antenna 70 to the RF connector 16B of the microwave circuit module 69, that is, a plug-in method, can be employed, the amount of the reflection at the connecting section between the microwave circuit module 69 and the element antenna 70 is small, resulting in an increase in performance. The reference numeral 72 in the figures represents the radiator section of the element antenna 70 and the RF connector 71 is placed on the opposite side from the radiator section 72.

(b) Second Embodiment

Figure 8:
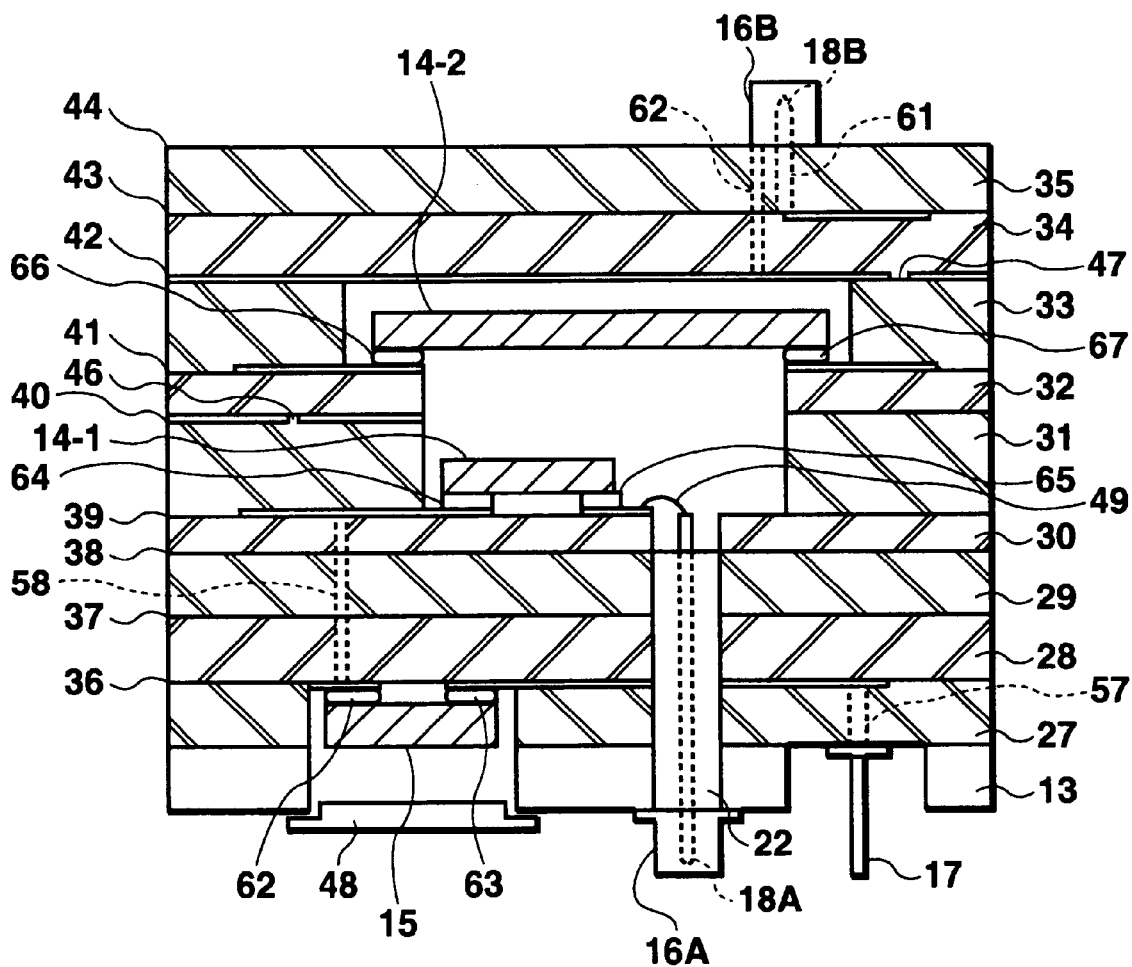
FIG. 8 is a II—II cross sectional view of a microwave circuit module according to a second embodiment of the present invention.

FIG. 8 shows a cross section of a microwave circuit module according to a second embodiment of the present invention. in the first embodiment, adhesion is used as a method for fixing the microwave circuits 14-1 and 14-2 and the control circuit 15, and wire bonding is used as a method to electrically connecting the conductors on the microwave circuits 14-1 and 14-2 and on the control circuit 15 to the conducting lines (pads) or the like. In the second embodiment, on the other hand, fixing and electrical connection of the microwave circuits 14-1 and 14-2 and the control circuit 15 are realized by employing bumps 62 through 67. The mounting plane of the microwave circuits 14-1 and 14-2 are changed to the upper surface of the dielectric layers 30 and 32 to suit the bump connection.

The bumps 62 through 67 are formed by a material with high electrical conductivity, such as gold. When fixing and electrically connecting using the bumps 62 through 67, ball-shaped bumps 62 through 67 are first placed on predetermined sections of the conductor appearing on the surfaces of the microwave circuits 14-1 and 14-2 and the control circuit 15. Then, the microwave circuits 14-1 and 14-2 and the control circuit 15 are rotated and positioned so that the bumps 62 through 67 oppose predetermined sections of the conducting lines 36, 39, and 41. Pressure, supersonics, or the like is then applied. In this manner, the conductors appearing on the surfaces of the microwave circuits 14-1 and 14-2 and of the control circuit 15 are fixed and connected to the bumps 62 through 67 and the bumps 62 through 67 and the conducting lines 36, 39, and 41 are fixed and connected with each other. In FIG. 8, the bumps 62 through 67 are not spherical because the bumps are flattened during application of the pressure or supersonics.

As described, in the second embodiment, because the bumps 62 through 67 are used for fixing and electrical connection, there is no need to provide bonding pads on the conducting lines 36, 39, and 41 for wire bonding or to provide through holes as an alternative or additional structure to these pads. Therefore, the space required for equipping and storing the microwave circuits 14-1 and 14-2 and the control circuit 15 can be reduced compared to the first embodiment which employs wire bonding. By doing so, an even smaller microwave circuit module can be obtained. Moreover, because adhesives for fixing microwave circuits 14-1 and 14-2 and the control circuit 15 and wire bonders, devices for applying wire bonding, are no longer required, advantages such as increase in the performance, reliability, and stability of the microwave circuit module or decrease in the manufacturing costs can be obtained. In addition, it is preferable that the pattern of the conducting lines, such as the conducting lines 39, etc., which are the object of the fixing and connection by the bumps, is shaped into a coplanar line so that the section for fixing and connecting by the bumps can be easily secured.

(c) Third Embodiment

Figure 9:
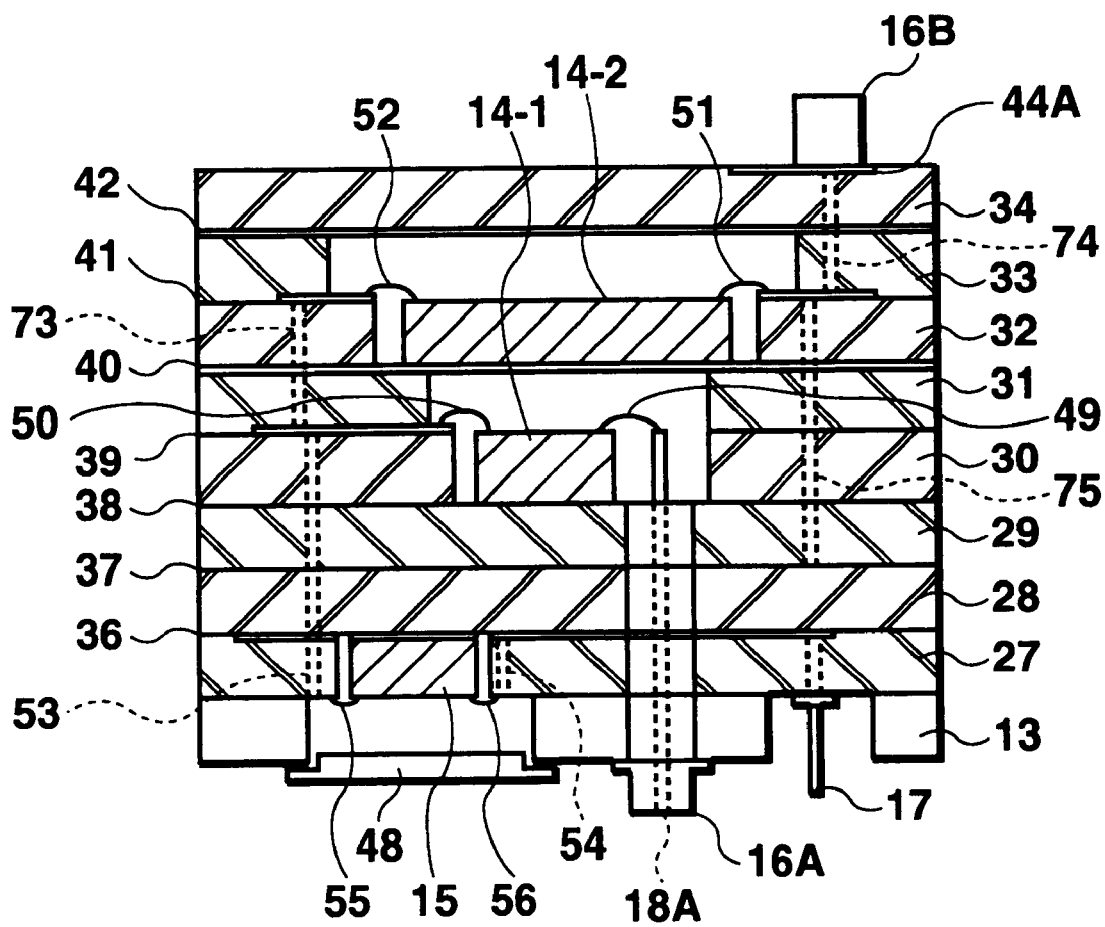
FIG. 9 is a II—II cross sectional view of a microwave circuit module according to a third embodiment of the present invention.

A cross section of a microwave circuit module according to a third embodiment of the present invention is shown in FIG. 9. In the third embodiment, through holes 73 and 74 are provided in place of the coupling windows 46 and 47 provided in the first embodiment. Conductors are embedded or filled in the through holes 73 and 74 for connection. Although the third embodiment has a disadvantage in that the number of through holes is greater than in the first embodiment, because there is no need for providing the conducting line 43 to be coupled to the conducting line 41 through the coupling window 47, two dielectric layers 34 and 35 in the first embodiment can be replaced by one dielectric layer 34, thereby reducing both height and manufacturing cost. In the figure, the reference numeral 75 represents a through hole used to connect the control circuit 15 and the microwave circuit 14-2, which is not shown in the FIG. 1. The reference numeral 44A represents a conductor to be connected to the outer conductor of the RF connector 16B and is provided on the upper surface of the dielectric layer 34 which functions as a top lid. Additionally, although there is a need to provide a hole, having a larger radius than each of the through holes, corresponding to each of the through holes on each of the ground conducting lines for avoiding contact or coupling of the conductors in each of the through holes and each of the ground conducting lines, these holes are not shown in the figure.

(d) Fourth Embodiment

Figure 10:
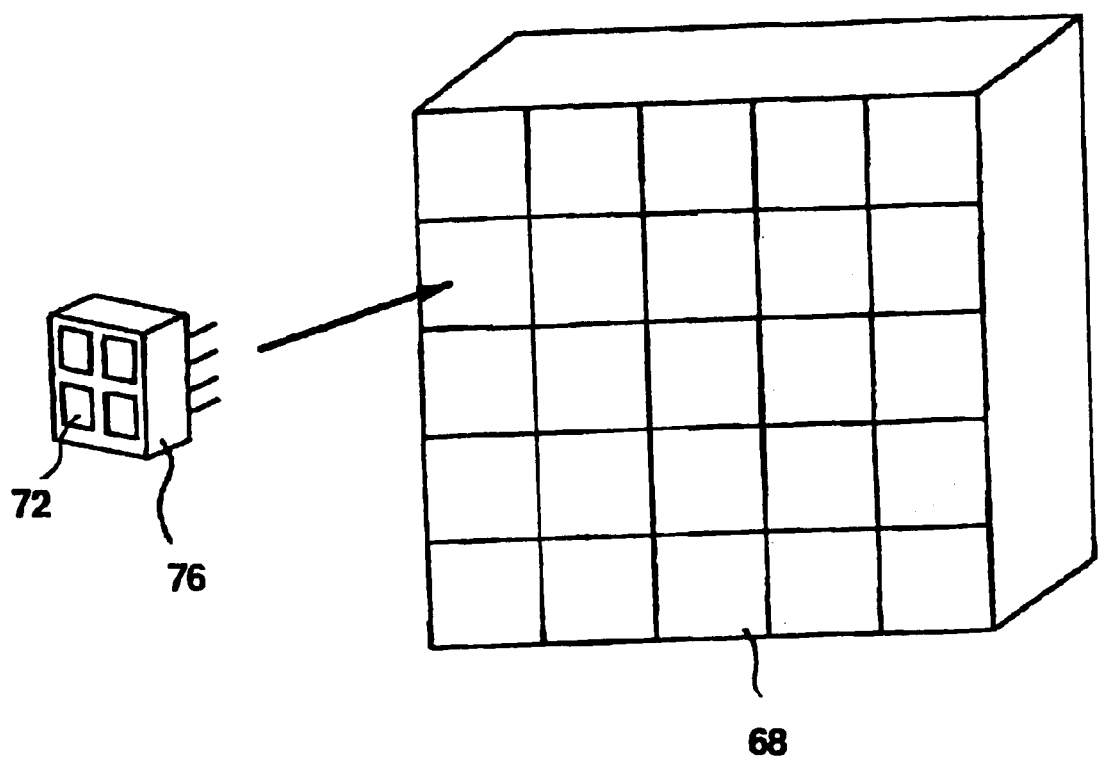
FIG. 10 is a partially disassembled perspective view showing one usage example of a microwave circuit module according to a fourth embodiment of the present invention.

FIG. 10 shows a microwave circuit module 76 according to a fourth embodiment of the present invention, and its usage. The microwave circuit module 76 according to the fourth embodiment includes an element antenna of a phased array antenna 68 and a microwave circuit for processing a microwave signal and supplying to the element antenna integrated as a single module. In the example shown, the module is shown to have four radiator sections 72, but it is also possible to equip a larger number or smaller number of radiator sections 72 by a microwave circuit module 76. The radiator section 72 can be formed as a print antenna.

Figure 11:
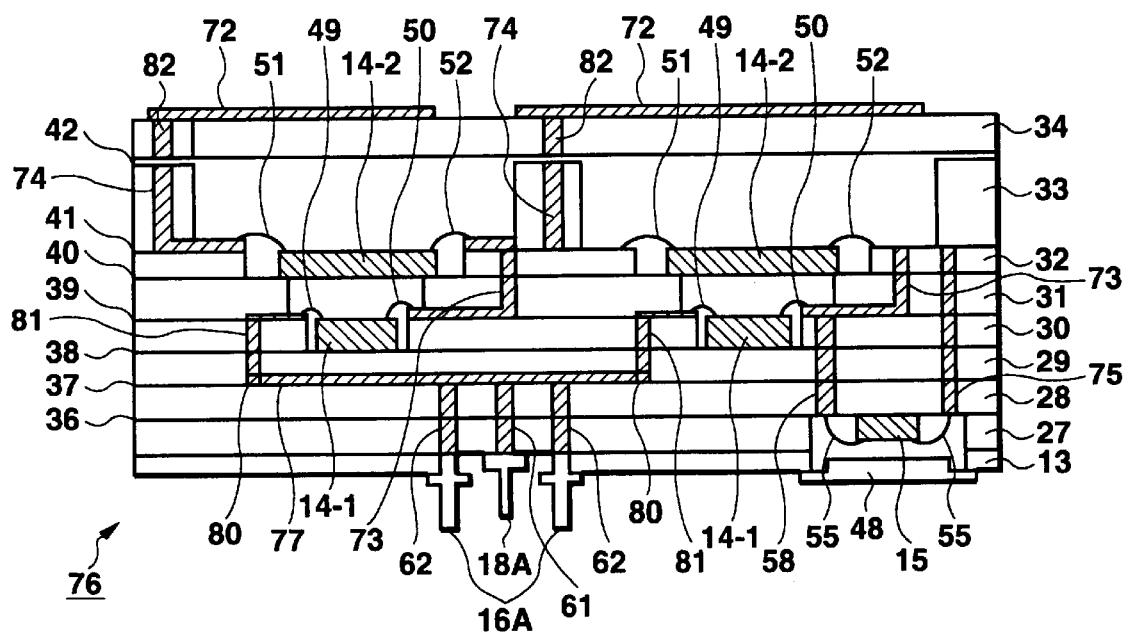
FIG. 11 is a V—V cross sectional diagram showing the structure of the microwave circuit module shown in FIG. 10.
Figure 12C:
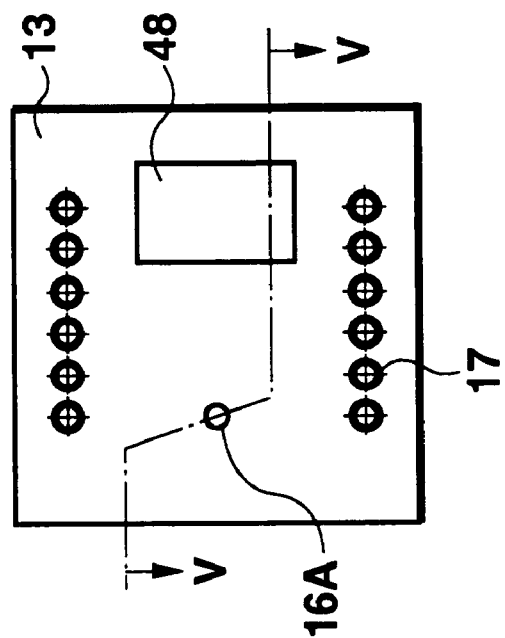
FIG. 12C is a view of the exterior appearance of the microwave circuit module shown in FIG. 10 showing the connector side surface.
Figure 12B:
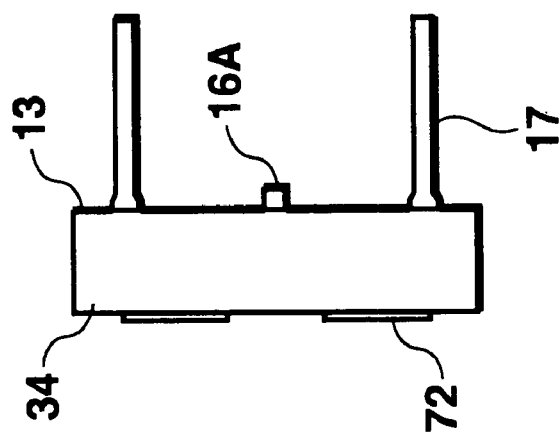
FIG. 12B is a side view showing exterior appearance of the microwave circuit module shown in FIG. 10.
Figure 12A:
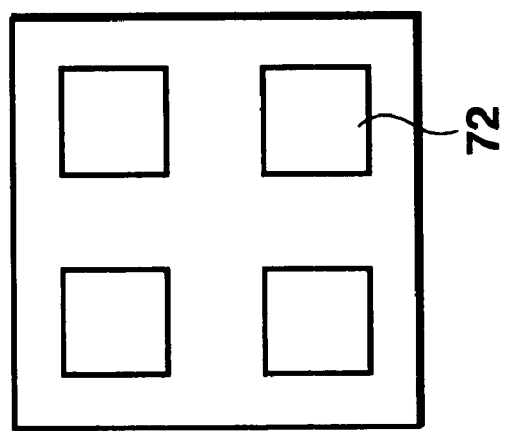
FIG. 12A is a view of the exterior appearance of the microwave circuit module shown in FIG. 10 showing the radiator section side surface.

FIG. 11 shows a cross section of the microwave circuit module 76 according to the fourth embodiment and FIGS. 12A, 12B, and 12C show the exterior appearance of the microwave circuit module 76. The microwave circuit module 76 has a rectangular flat board shape. Four radiation sections 72 are provided on the surface shown at the upper side of FIG. 11, that is on FIG. 12A, and twelve control-signal pins 17 and an RF connector 16A are provided on the surface shown at the lower side of FIG. 12, that is on FIG. 12C. In FIG. 11, two microwave circuits 14-1, two microwave circuits 14-2, a control circuit 15, and an RF connector 16A are also shown. The control-signal pins 17 are not shown. Therefore, as FIG. 11 is for describing the structure of the fourth embodiment in more detail, this figure does not show the entire V—V cross section illustrated in FIG. 12C. Members or structures such as the conducting lines, through holes, and bonding wires are neither shown nor described except to explain the feature of this embodiment. A person skilled in the art will be able to clearly understand the structure of the fourth embodiment by referring to the description of the present invention.

The structure of the microwave circuit module 76 according to the fourth embodiment slightly differs from that of the other embodiments.

Figure 13:
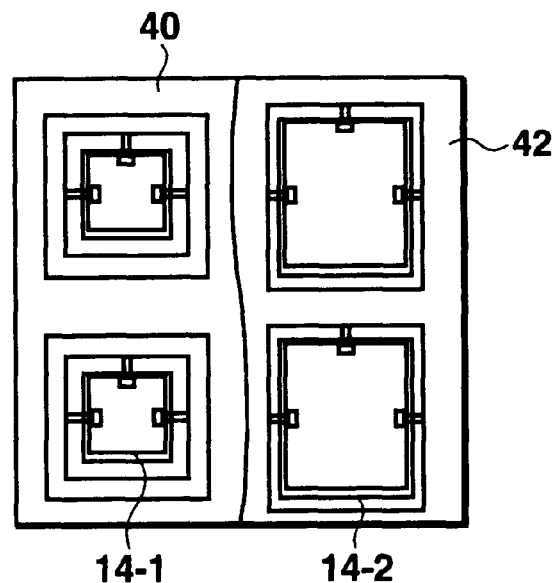
FIG. 13 is a partial schematic cross sectional view showing the inside structure of the microwave circuit module shown in FIG. 10.

First, the microwave circuits according to each of the above embodiments store one first-stage microwave circuit 14-1, one second-stage microwave circuit 14-2, and one control circuit for controlling these microwave circuits. In contrast, the microwave circuit module 76 according to the fourth embodiment, as shown in FIG. 13 which shows the cross section with a portion cut out, stores four microwave circuits 14-1, four microwave circuits 14-2, and one control circuit 15 for controlling the microwave circuits. Each of the four microwave circuits 14-1 and 14-2 are provided corresponding to each of the four radiator sections 72. Thus, if the number of radiator sections 72 is changed, the number of microwave circuits 14-1 and 14-2 can be varied accordingly. If there is no obstruction on the feeding path nor functional obstruction, it is also possible to provide one microwave circuit 14-1 or 14-2 to be shared by a plurality of radiator section 72. The present invention enables such variation.

Second, although the casing for storing the microwave circuits 14-1 and 14-2 and the control circuit 15 is realized by similar lamination of a plurality of dielectric layers and metal conductor layer 13 as in the first through third embodiments, especially the third embodiment which has the same number of the dielectric layers, the function of each of the dielectric layers slightly differs from the functions of the corresponding layers in previous embodiments. For example, the dielectric layer 34, located at the top of the multi-layered structure, is used to provide a plane for providing an RF connector 16B in the third embodiment. In the fourth embodiment, this dielectric layer provides a plane for providing the radiator sections 72. Moreover, the conducting line 37 is also used as a conducting line for providing three branch-line type distributors 77.

The control signal transmission path in the microwave circuit module 76 according to the fourth embodiment is as follows. The signal applied from the outside to the control-signal pin 17 is connected and input to the control circuit 15 through a through hole (not shown) provided on the dielectric layer 27, a portion of the conducting line 36, and a bonding wire 54 (not shown). Based on this signal, the control circuit 15 generates control signals to be supplied to the microwave circuits 14-1 and 14-2. Among the control signals generated at the control circuit 15, the control signal for the microwave circuits 14-1 is supplied to the four microwave circuits 14-1 through a wire 55, a conductor within a through hole 58, a portion of the conducting line 39 (a portion of which is not shown), and a wire (not shown). The other control signals for the microwave circuits 14-2 are supplied to the four microwave circuit 14-2 through a wire 55, a conductor in a through hole 75, a portion of the conducting line 41 (a portion of which is not shown), and a wire 52.

Figure 14:
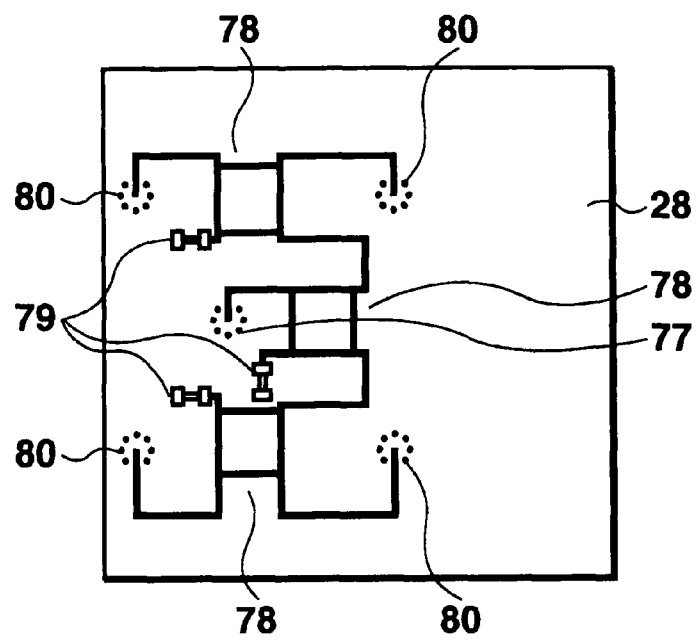
FIG. 14 is a plane view showing a structure of a distributor in the microwave circuit module shown in FIG. 10.

The microwave signal transmission path in the microwave circuit module 76 according to the fourth embodiment is as follows. The RF connector 16A has a pseudo coaxial structure in which a conductor is embedded or filled in a plurality of through holes 62 formed to have an arc or a horseshoe shape with an inner conductor 18A at the center, similar to the RF connector 16B in the first and second embodiments. The reference numeral 61 in FIG. 11 represents a through hole where the inner conductor 18A is to be inserted or a conductor connected to the inner conductor 18A is to be embedded or filled. In FIG. 11, a through hole 62 seems to touch the branch-line type distributor 77 which is a part of the conducting line 37, but this is only because of the drawing and they do not actually touch, as shown in FIG. 14.

A microwave signal applied from the outside to the RF connector 16A is supplied to the pattern on the conductor 37 through the pseudo coaxial structure. As shown in FIG. 14, the conducting line 37 present between the dielectric layers 28 and 29 has a terminal structure 77, three branch-line type distributors 78, three terminating resistors 79, four terminal structures 79, and a pattern conductor for mutually connecting these components. The terminal structure 77 is a structure in which conductors in the through holes 62 are placed in an arc shape with a conductor in the through hole 61 being its center and is used as a terminal for inputting the microwave signal from the RF connector 16A to the conducting line 37.

Three branch-line type distributors 78 are cascaded so that the microwave signal is branched into two by the first-stage branch-line type distributor 78 are further branched into two at the two second-stage branch-line type distributors 78. The terminal structure 77 is connected to the front branch-line type distributor 78, and thus, the microwave signal supplied through the terminal structure 77 is branched into four at the end. The terminals, among four terminals that each branch-line type distributor 78 includes, which are not used for the signal input/output are terminated by a terminating resistor 79. Each of the microwave signals, which have been branched into four, is applied to the terminal structure 80. The terminal structures 80 are provided corresponding to the four microwave circuits 14-1 and have a pseudo coaxial structure similar to the terminal structure 77. The through holes acting as the outer conductor are not shown in FIG. 11.

Each of the terminal structures 80 is connected through a through hole 81 to a corresponding circuit among the four microwave circuits 14-1, a portion of the conducting line 39, and a wire 49. The microwave circuit 14-1 processes the microwave signal supplied through this route based on the control signal supplied through the route described above, and supplies to the corresponding microwave circuit 14-2 through a wire 50, a portion of the conducting line 39, a conductor in the through hole 73, a portion of the conducting line 41 (a portion of which is not shown), and a wire 52. The through hole 73 preferably has a pseudo coaxial structure, similar to the through hole 81 and the terminal structure 80 related to the through hole 81. The microwave circuit 14-2 processes a microwave signal based on a control signal supplied on the route described above and supplies to a corresponding radiator section 72 through a wire 51, a portion of the conducting line 41 (a portion of which is not shown), a through hole 74, a portion of the conducting line 42 (a portion of which is not shown), and a through hole 82. The through holes 74 and 82 can also be formed as a pseudo coaxial structure.

Therefore, according to the fourth embodiment of the present invention, a microwave circuit module 76 can be realized in which even the radiator sections 72 are integrated. In an example where the microwave circuit module and the element antennas are separately structured, for example, an example shown in FIG. 7, an RF connector for connecting the microwave circuit module and the element antenna is necessary, but this RF connector is not required for the structure of the fourth embodiment. Thus, manufacturing costs can be reduced by reducing the number of RF connectors. Moreover, to execute the step for connecting by the RF connector, in general, the size of the device must have some room for the connection step to be executed. In the fourth embodiment, this required space for connection by the RF connector is no longer necessary, enabling placement of the radiator sections with reduced distance in between. This fact and the fact that a plurality of the radiator sections 72 can be provided on a single module by included distributors 77 together provide an advantage that the equipped density of the radiator sections is improved. Because the size of the element antenna, especially its radiator section, is generally determined based on the radiating wavelength, both smaller radiator section and smaller distance between the radiator sections are required as the used frequency becomes higher. The microwave circuit module according to the fourth embodiment can sufficiently satisfy this requirement.

(e) Fifth Embodiment

Figure 15:
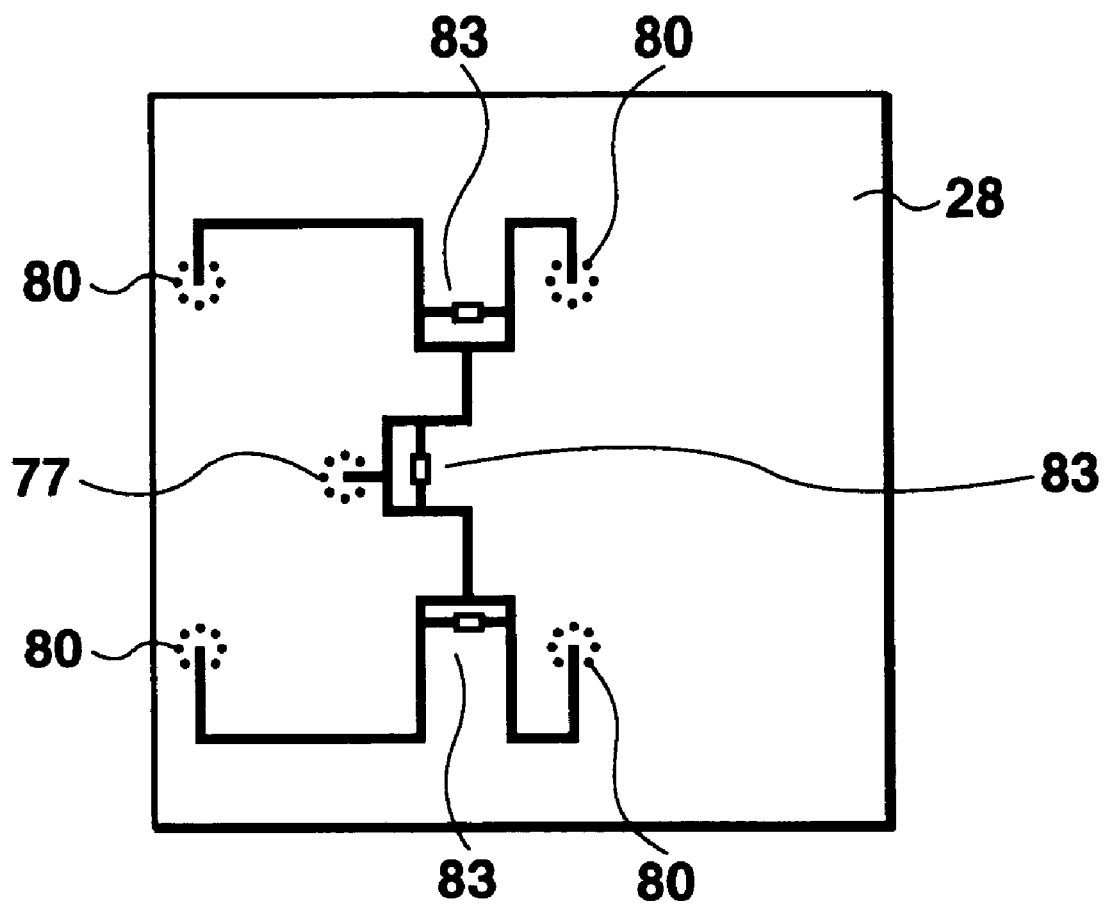
FIG. 15 is a planar view showing a structure of a distributor in a microwave circuit module according to a fifth embodiment of the present invention.

FIG. 15 shows a partial structure of a microwave circuit module according to a fifth embodiment of the present invention. In the microwave circuit module according to the fifth embodiment, the branch-line type distributors 77 of the fourth embodiment are replaced by Wilkinson distributors 83. As in the previous embodiment, when the present invention is applied as an element antenna integrated module, various structures can be used as the distributor. The distributor can even be an active element rather than a passive element. Similarly, both microwave circuits 14-1 and 14-2 can also be passive circuits. It is also possible to provide the control circuit 15 outside the module, or even to omit the control circuit 15 altogether.

(f) Sixth Embodiment

Figure 16:
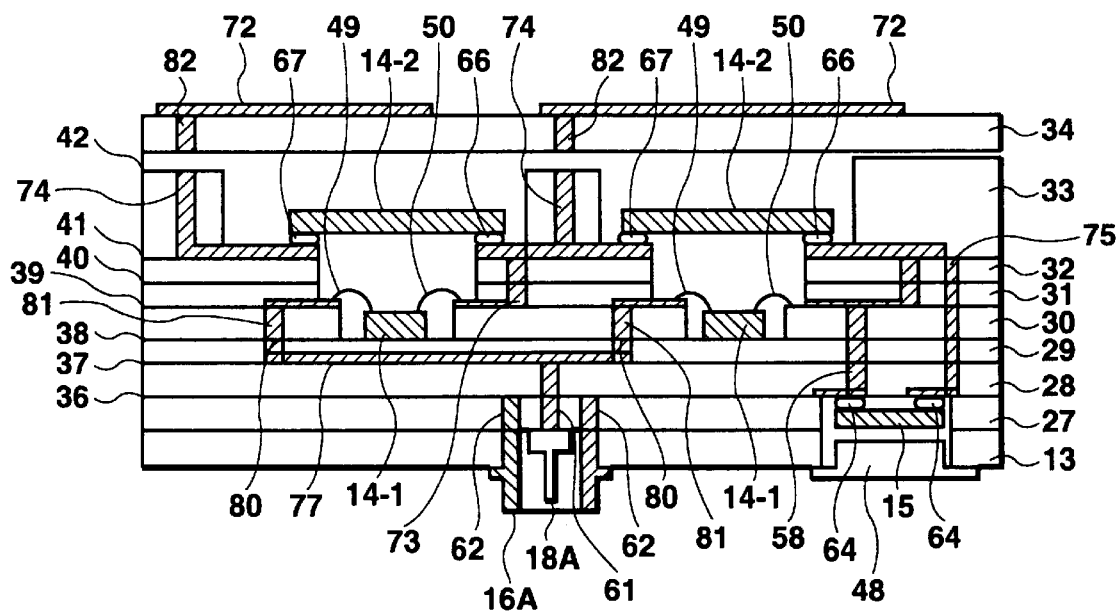
FIG. 16 is a V—V cross sectional diagram showing a structure of a microwave circuit module according to a sixth embodiment of the present invention.

FIG. 16 shows a cross section of a microwave circuit module according to a sixth embodiment of the present invention. The sixth embodiment is a variation of the fourth embodiment based on the third embodiment. It is also possible to apply the present invention by modifying the fifth embodiment based on the third embodiment. The microwave circuit 14-1 can also be connected with bumps.

What is claimed is:

1. A radio-frequency circuit module comprising: first and second radio-frequency circuit units for processing a radio-frequency signal;
   a casing for storing said first and second radio-frequency circuit units, having first and second radio-frequency circuit unit storing spaces for respectively storing said first and second radio-frequency circuit units, and having first and second transmission line planes parallel to each other;
   an inter-unit signal transmission line for interconnecting said first and second radio-frequency circuit units for transmitting a radio-frequency signal from said first radio-frequency circuit unit to said second radio-frequency circuit unit, having a first portion extending from said first radio-frequency circuit unit storing space along said first transmission line plane, a second portion extending from said second radio-frequency circuit unit storing space along said second transmission line plane, and a third portion for electrically connecting said first and second portions;
   a first RF connector provided on the outer surface of said casing;
   a first connector-unit signal transmission line connecting said first radio-frequency circuit unit to said first RF connector for transmission of a radio-frequency signal from said first RF connector to said first radio-frequency circuit unit;
   a second RF connector provided on the outer surface of said casing; and
   a second connector-unit signal transmission line connecting said second radio-frequency circuit unit to said second RF connector for transmission of a radio-frequency signal from said second radio-frequency circuit unit to said second RF connector,
   wherein said first and second RF connectors are placed on different planes among the planes forming said outer surface of said casing.

2. A radio-frequency circuit module according to claim 1, wherein
   said third portion has a three-dimensional structure for inter-coupling said first and second portions along a direction intersecting said first and second transmission line planes.

3. A radio-frequency circuit module according to claim 2, wherein
   said three-dimensional structure includes a first coupling window as an opening provided on a conducting line maintained at a predetermined potential and parallel to and put between said first and second transmission line planes, and a dielectric layer present for providing electromagnetic coupling path between said first coupling window and said first and second portions.

4. A radio-frequency circuit module according to claim 2, wherein
   said three-dimensional structure has a dielectric layer present between said first and second portions, and a conductor penetrating through said dielectric layer from said first portion, to said second portion.

5. A radio-frequency circuit module according to claim 1, wherein
   said first and second radio-frequency circuit unit storing spaces are formed so that at least a portion of a projection of said first radio-frequency circuit unit along a projection direction perpendicular to said first and second transmission line planes overlaps with a portion of a projection of said second radio-frequency circuit unit along said projection direction.

6. A radio-frequency circuit module according to claim 1, wherein
   at least one of said first and second connector-unit signal transmission lines has a second coupling window as an opening provided on a conducting line maintained at a predetermined potential and parallel to said first and second transmission line planes, and unit-side and connector-side conductors electromagnetically coupled through said second coupling window and respectively connected to a radio-frequency circuit unit and an RF connector which are the connection target.

7. A radio-frequency circuit module according to claim 1, wherein said first connector-unit signal transmission line is a coaxial line.

8. A radio-frequency circuit module according to claim 7, where in
   said coaxial line is a pseudo coaxial line having an inner conductor and a plurality of conductors separated from the inner conductor by a predetermined distance.

9. A radio-frequency circuit module according to claim 1, wherein said second connector-unit signal transmission line is a coaxial line.

10. A radio-frequency circuit module according to claim 9, wherein
    said coaxial line is a pseudo coaxial line having an inner conductor and a plurality of conductors separated from the inner conductor by a predetermined distance.

11. A radio-frequency circuit module comprising:
    first and second radio-frequency circuit units for processing a radio-frequency signal;
    a casing for storing said first and second radio-frequency circuit units, having first and second radio-frequency circuit unit storing spaces for respectively storing said first and second radio-frequency circuit units, and having first and second transmission line planes parallel to each other;

an inter-unit signal transmission line for interconnecting said first and second radio-frequency circuit units for transmitting a radio-frequency signal from said first radio-frequency circuit unit to said second radio-frequency circuit unit, having a first portion extending from said first radio-frequency circuit unit storing space along said first transmission line plane, a second portion extending from said second radio-frequency circuit unit storing space along said second transmission line plane, and a third portion for electrically connecting said first and second portions;

a radiator section provided on the outer surface of said casing; and a unit-radiator section transmission line provided inside said casing for connecting said second radio-frequency circuit unit to said radiator section.

12. A radio-frequency circuit module according to claim 11, further comprising:

a first RF connector provided on the outer surface of said casing, and a first connector-unit signal transmission line connecting said first radio-frequency circuit unit to said first RF connector for transmission of a radio-frequency signal from said first RF connector to said first radio-frequency circuit unit, wherein, said radiator section and said first RF connector are provided on different surfaces among the surfaces forming said outer surface of said casing.

13. A radio-frequency circuit module comprising:

first and second radio-frequency circuit units for processing a radio-frequency signal;

a casing for storing said first and second radio-frequency circuit units, having first and second radio-frequency circuit unit storing spaces for respectively storing said first and second radio-frequency circuit units, and having first and second transmission line planes parallel to each other;

an inter-unit signal transmission line for interconnecting said first and second radio-frequency circuit units for transmitting a radio-frequency signal from said first radio-frequency circuit unit to said second radio-frequency circuit unit, having a first portion extending from said fist radio-frequency circuit unit storing space along said first transmission line plane, a second portion extending from said second radio-frequency circuit unit storing space along said second transmission line plane, and a third portion for electrically connecting said first and second portions;

a plurality of radiator sections provided on the surface of said casing; and a plurality of said second radio-frequency circuit units provided to correspond to said plurality of radiator sections.

14. A radio-frequency circuit module according to claim 13, further comprising:

a plurality of said first radio-frequency circuit unit provided to correspond to said plurality of radiator sections.

15. A radio-frequency circuit module according to claim 14, further comprising:

a first RF connector provided on the outer surface of said casing, and a first connector-unit signal transmission line connecting each of said plurality of said first radio-frequency circuit units to said first RF connector for transmission of a radio-frequency signal from said first RF connector to each of said plurality of said first radio-frequency circuit unit, wherein, said first connector-unit signal transmission line has a branching member for branching the radio-frequency signal input from said first RF connector, corresponding to said plurality of first radio-frequency circuit units.

16. A radio-frequency circuit module according to claim 15, wherein said branching member has m distributors, where m is a natural number greater than 1, each for distributing the radio-frequency signal into n branches, where n is a natural number greater than 1, and said m distributors are interconnected so that the radio-frequency signal input from said first RF connector is branched into the number of said first radio-frequency circuit units.

17. A radio-frequency circuit module according to claim 16, wherein said distributor is a planar circuit.

18. A radio-frequency circuit module according to claim 17, wherein said distributor is either a branch-line type or a Wilkinson type distributor.

19. A radio-frequency circuit module according to claim 1, further comprising:

a plurality of laminated dielectric layers, and a plurality of conducting lines provided on the surfaces of said plurality of dielectric layers, wherein, said plurality of dielectric layers are shaped and laminated so that said first and second radio-frequency circuit unit storing spaces are formed, said plurality of conducting lines provide said first and second transmission line planes, and said third portion penetrates through at least one of said plurality of dielectric layers.

20. A radio-frequency circuit module according to claim 19, further comprising:

a control circuit stored in said casing for controlling said first and second radio-frequency circuit units.

21. A radio-frequency circuit module according to claim 20, wherein said control circuit is stored in a hole provided on a dielectric layer placed at the end of said plurality of dielectric layers, and said radio-frequency circuit module has a lid to close the hole for storing said control circuit.

22. A radio-frequency circuit module according to claim 1, further comprising:

bumps for fixing at least one of said first and second radio-frequency circuit units to said casing and for electrically connecting to a connecting target conductor present within said casing.

23. A radio-frequency circuit module according to claim 22, wherein said connecting target conductor is a coplanar line.

* * * * *